United States Patent
Ritchie et al.

(10) Patent No.: US 7,857,947 B2
(45) Date of Patent: Dec. 28, 2010

(54) UNIQUE PASSIVATION TECHNIQUE FOR A CVD BLOCKER PLATE TO PREVENT PARTICLE FORMATION

(75) Inventors: Alan A. Ritchie, Pleasanton, CA (US); Wei Ti Lee, San Jose, CA (US); Ted Guo, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 969 days.

(21) Appl. No.: 11/459,531

(22) Filed: Jul. 24, 2006

(65) Prior Publication Data

US 2007/0022952 A1 Feb. 1, 2007

Related U.S. Application Data

(60) Provisional application No. 60/703,379, filed on Jul. 27, 2005.

(51) Int. Cl.
*C23C 14/34* (2006.01)
*C23C 16/00* (2006.01)

(52) U.S. Cl. .......................... 204/192.15; 204/192.12; 427/250

(58) Field of Classification Search .......... 204/192.12, 204/192.15; 427/250
See application file for complete search history.

(56) References Cited

U.S. PATENT DOCUMENTS

| | | | |
|---|---|---|---|
| 4,234,622 A * | 11/1980 | DuBuske et al. ............ 427/587 |
| 5,558,717 A | 9/1996 | Zhao et al. | |
| 5,595,602 A | 1/1997 | Harlan | |
| 5,858,464 A | 1/1999 | Littau et al. | |
| 6,182,603 B1 | 2/2001 | Shang et al. | |
| 6,228,186 B1 * | 5/2001 | Pavate et al. ................ 148/557 |
| 6,468,908 B1 * | 10/2002 | Chen et al. ................... 438/687 |
| 6,553,932 B2 | 4/2003 | Liu et al. | |
| 6,669,829 B2 | 12/2003 | Feltsman et al. | |
| 6,858,116 B2 * | 2/2005 | Okabe et al. ............ 204/192.12 |
| 6,899,763 B2 | 5/2005 | Pokharna et al. | |
| 2001/0006070 A1 * | 7/2001 | Shang et al. .................. 134/1 |
| 2003/0148035 A1 | 8/2003 | Lingampalli | |
| 2004/0118519 A1 | 6/2004 | Sen et al. | |
| 2004/0221807 A1 | 11/2004 | Verghese et al. | |
| 2005/0263248 A1 | 12/2005 | Rocha-Alvarez et al. | |

OTHER PUBLICATIONS

PCT International Search Report and Written Opinion dated Sep. 18, 2007 for PCT International Search Report PCT/US2006/28582.
Notice to File a Response dated Nov. 17, 2009 for Korean Patent Application No. 10-2008-7004697.
Notice of Final Rejection dated May 10, 2010 for Korean Patent Application No. 10-2008-7004697.

* cited by examiner

*Primary Examiner*—Rodney G McDonald
(74) *Attorney, Agent, or Firm*—Patterson & Sheridan, LLP (57) ABSTRACT

Blocker plates for chemical vapor deposition chambers and methods of treating blocker plates are provided. The blocker plates define a plurality of holes therethrough and have an upper surface and a lower surface that are at least about 99.5% pure, which minimizes the nucleation of contaminating particles on the blocker plates. A physically vapor deposited coating, such as an aluminum physically vapor deposited coating, may be formed on the upper and lower surfaces of the blocker plates. Chemical vapor deposition chambers including blocker plates having a physically vapor deposited coating thereon are also provided.

17 Claims, 5 Drawing Sheets

FIG. 6

UNIQUE PASSIVATION TECHNIQUE FOR A CVD BLOCKER PLATE TO PREVENT PARTICLE FORMATION

CROSS-REFERENCE TO RELATED APPLICATIONS

This application claims benefit of U.S. Provisional Patent Application Ser. No. 60/703,379, filed Jul. 27, 2005, which is herein incorporated by reference.

BACKGROUND OF THE INVENTION

1. Field of the Invention

Embodiments of the present invention generally relate to gas distribution assemblies for chemical vapor deposition chambers. More particularly, embodiments of the invention relates to blocker plates that resist deposition.

2. Description of the Related Art

Sub-quarter micron multilevel metallization is one of the key technologies for the next generation of very large scale integration (VLSI). The multilevel interconnects that lie at the heart of this technology require planarization of high aspect ratio apertures, including contacts, vias, lines or other features having aperture widths less than 0.25 µm and aperture depths greater than the aperture widths. Reliable formation of these interconnects is very important to the success of VLSI and to the continued effort to increase circuit density and quality on individual substrates and die.

Metal interconnects are typically formed by physical vapor deposition (PVD), chemical vapor deposition (CVD), electrochemical deposition and/or sequential combinations thereof. CVD metal films, such as CVD aluminum films, provide excellent conformal coverage of features. CVD of aluminum films is typically performed with a bubbled precursor which is transported with means of a carrier gas into the reactor. The bubbled precursor is typically directed though a gas distribution assembly including a showerhead and a blocker plate situated near the top of the chamber. The precursor reacts to form a layer of material on the surface of a substrate that is positioned on a substrate support in the chamber. However, some of the precursor by-products may react to deposit the material on the interior surfaces of the chamber, forming contaminating deposits. Over time, the contaminating deposits may flake off and damage a substrate during processing or affect chamber performance to the extent that the chamber cannot perform reliably. The generation of the contaminating particles may be accelerated depending on the choice of the CVD precursor gas.

The formation of deposits on components of the gas distribution assembly, such as the blocker plate, is particularly problematic. Because of the large surface area of the blocker plate and the proximity of the blocker plate to the substrate, deposits that are formed on the blocker plate may detach and land on the substrate.

Attempts have been made to chemically clean blocker plates. However, the chemical solutions used to clean the blocker plates often leave contaminating residues that must be removed from the blocker plates.

Therefore, there remains a need for a method of reducing the formation of contaminating deposits on chamber components such as blocker plates.

SUMMARY OF THE INVENTION

The present invention generally provides a blocker plate for distributing gases and methods of manufacturing the blocker plate. The blocker plate comprises a coating on at least the upper surface and the lower surface, wherein the coating is a material that is at least about 99.5% pure, and wherein the blocker plate defines a plurality of holes therethrough that extend between the upper surface and the lower surface. In one embodiment, the material is an aluminum coating that is deposited by physical vapor deposition and comprises about 99.5% aluminum and about 0.5% copper. In a further embodiment, the aluminum coating is formed on the blocker plate by physical vapor depositing the aluminum coating to a thickness of about 1 µm, degassing the blocker plate, and then depositing the aluminum coating for a second thickness of about 1 µm.

In other embodiments, a chemical vapor deposition chamber is provided. The chemical vapor deposition chamber includes a blocker plate comprising an upper surface and a lower surface, wherein the upper surface and the lower surface each comprise a material that is at least about 99.5% pure and free of contaminants that promote chemical vapor deposition, and wherein the blocker plate defines a plurality of holes therethrough that extend between the upper surface and the lower surface.

In further embodiments, a method of reducing particle contamination in a chemical vapor deposition chamber by minimizing the formation of particles in the gas line that connects the gas source to the chemical vapor deposition chamber is provided by using three-way valves and segments that are easily electropolished.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention provide a blocker plate for a chemical vapor deposition chamber. The blocker plate has an upper surface and a lower surface each comprising a material that is at least about 99.5% pure, preferably free of any material that promotes chemical vapor depostion. For example, the upper and lower surface may be about 99.5% aluminum and about 0.5% copper. The primary blocker plate material may be aluminum, aluminum oxide, tungsten, titanium, tantalum, silicon or a silicon oxide. In certain embodiments, the blocker plate consists of a base material that is less than about 98% pure and having a coating of the material that is at least 99.5% pure. The blocker plates have a minimal (if any) amount of components, such as iron, manganese, and nickel, which are believed to nucleate the growth of contaminating particles on the blocker plates.

Figure 1:
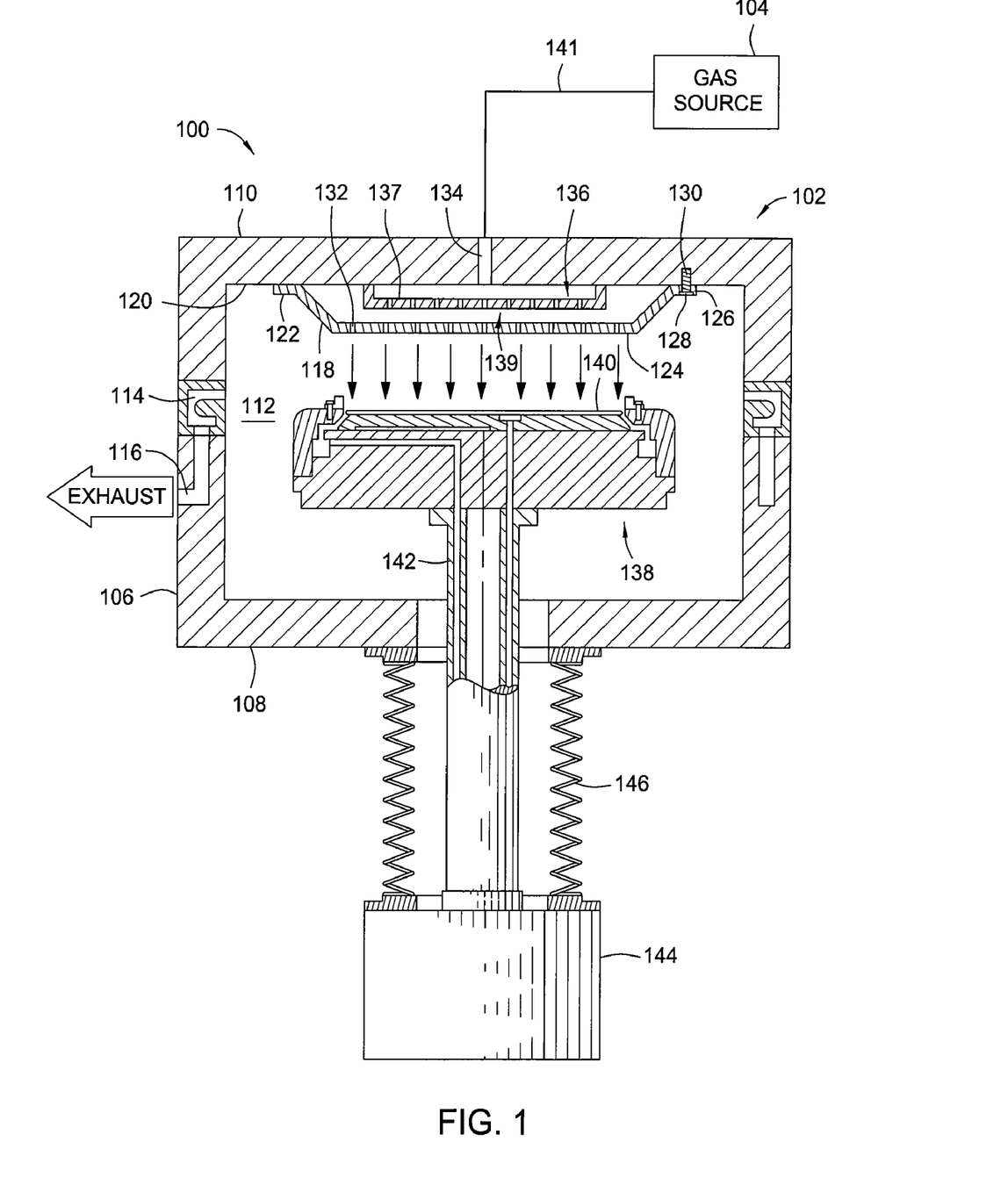
FIG. 1 is a schematic cross-sectional view of a chemical vapor deposition system according to an embodiment of the invention.

FIG. 1 is a cross-sectional view of a chemical vapor deposition system 100 including a blocker plate 136, according to an embodiment of the invention. The system 100 generally includes a chamber 102 coupled to a gas source 104 via gas line 141. The gas source 104 may be an ampoule. The chamber 102 has walls 106, a bottom 108 and a lid 110 that define a process volume 112. The walls 106 and bottom 108 are typically fabricated from a unitary block, such as a block of aluminum. The chamber 102 may also include one or more shields (not shown) that prevent deposition of material on the walls 106 of the chamber. The chamber 102 contains a pumping ring 114 that couples the process volume 112 to an exhaust port 116. The exhaust port 116 is coupled to various pumping components (not shown) that exhaust and control the pressure within the process volume 112.

The lid 110 is supported by the walls 106 and can be removed to service the chamber 102. The lid 110 is generally comprised of aluminum and may additionally contain heat transfer fluid channels for regulating the temperature of the lid 110 by flowing a heat transfer fluid therethrough.

A showerhead 118 is coupled to an interior side 120 of the lid 110. The showerhead 118 is typically fabricated from aluminum. The showerhead 118 generally includes a perimeter mounting ring 122 that surrounds a "dish-shaped" center section 124. The mounting ring 122 includes a plurality of mounting holes 126 that pass therethrough, each accepting a vented mounting screw 128 that threads into a mating hole 130 in the lid 110. The center section 124 includes a perforated area 132 that facilitates passage of gases therethrough. The showerhead 118 may be coupled to an RF power supply (not shown) for plasma enhanced chamber cleaning.

A gas feedthrough 134 is disposed in the lid 110. The gas feedthrough 134 is coupled to the gas source 104, such that process and other gases may be introduced to the process volume 112 by passing through the feedthrough 134 and showerhead 118. Typically, cleaning or passivating gases from a source (not shown) are also introduced through the gas feedthrough 134 to the process volume 112. A perforated blocker plate 136 is disposed between the showerhead 118 and gas feedthrough 134 to enhance the uniform distribution of gases passing through the showerhead 118 and into the chamber 102. The blocker plate 136 may be fabricated from aluminum. The blocker plate 136 has an upper surface 137 and a lower surface 139 each comprising a material that is at least about 99.5% pure. The upper surface and the lower surface of the blocker plate 136 will be further shown and described with respect to FIGS. 2 and 3.

A substrate support assembly 138 is disposed beneath the showerhead 118. The substrate support assembly 138 includes a shaft 142 coupled thereto and supports a substrate 140 during processing. The substrate support assembly is typically accessed by the substrate 140 through a port (not shown) in the walls 106. A shaft 142 is coupled between the substrate support assembly 138 and a lift mechanism 144. The lift mechanism 144 moves the substrate support assembly 138 between an elevated position as shown and a lowered position. A bellows 146 disposed between the substrate support assembly 138 or shaft 142 and the chamber bottom 108 provides a vacuum seal between the process volume 112 and the atmosphere outside the chamber 102 while facilitating movement of the substrate support assembly 138. Lift pins (not shown) are disposed through the substrate support assembly 138 to lift a substrate for transfer into and out of the chamber.

In operation, the semiconductor substrate 140 is secured to the substrate support assembly 138 by providing a vacuum therebetween. The temperature of the substrate is elevated to a pre-determined process temperature by regulating thermal transfer to the support assembly by a heating element (not shown) disposed in the support assembly.

FIG. 1 illustrates only one type of chemical vapor deposition chamber that may be modified to include the blocker plates provided according to embodiments of the invention. One example of a chemical vapor deposition chamber that may be used is an A×Z chamber, available from Applied Materials, Inc. of Santa Clara, Calif.

Figure 2:
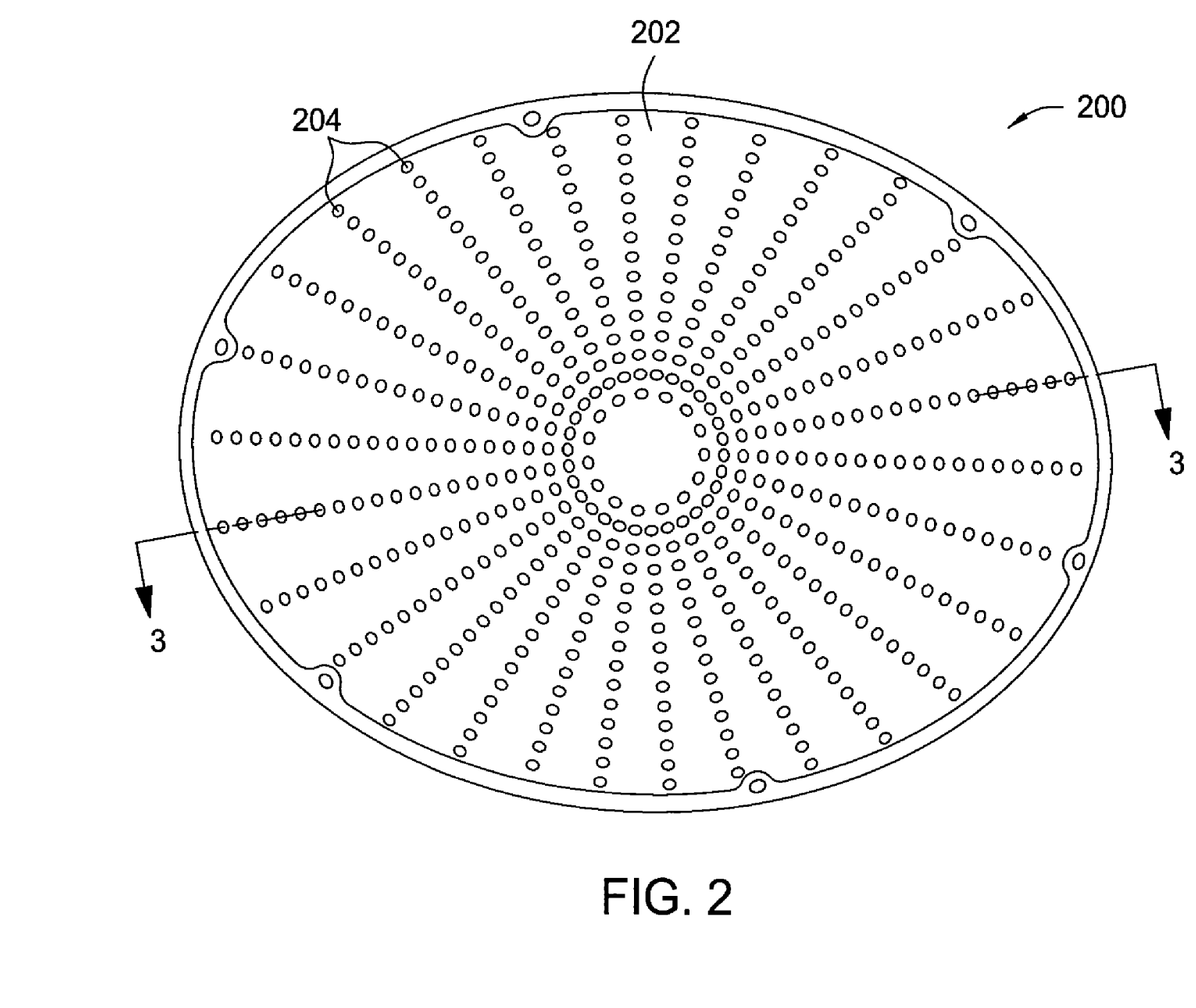
FIG. 2 is a top plan view of a blocker plate according to an embodiment of the invention.
Figure 3:
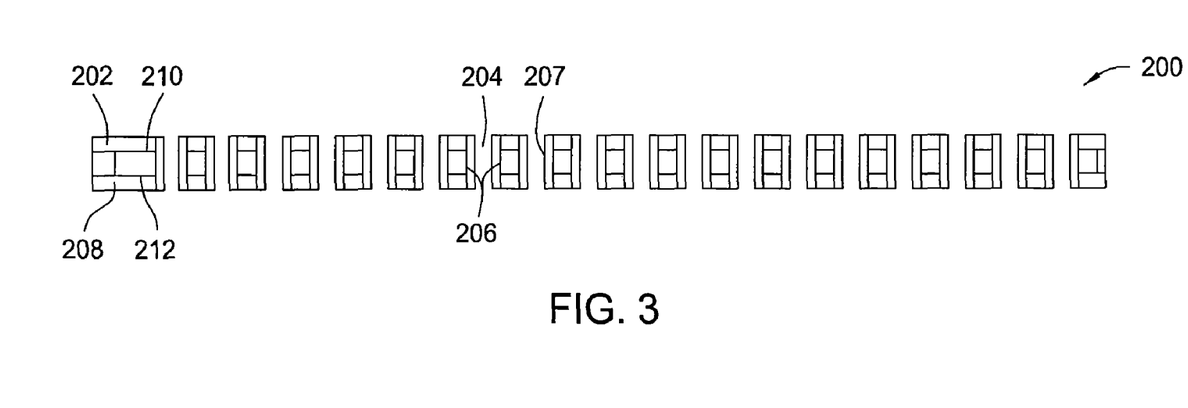
FIG. 3 is a cross-sectional view of the blocker plate of FIG. 2.

An embodiment of a blocker plate having a coating on its upper and lower surfaces is shown in FIGS. 2 and 3. The coating and methods of depositing the coating will be described in further detail below.

FIG. 2 is a top plan view of a blocker plate 200 that having a coating 202 on the upper surface of the blocker plate. Blocker plate 200 defines a plurality of holes 204 therethrough. For example, the blocker plate may have about 1400 holes. The diameter of the holes may be between about 10 mils and about 30 mils, such as about 14 mils.

FIG. 3 is a side, cross-sectional view of the blocker plate 200. As can be seen in FIG. 3, the blocker plate has a coating 202 on its upper surface 210 and a coating 208 on its lower surface 212. Optionally, the coating 202 and/or the coating 208 may extend into the holes 204 such that a coating 207 may be present on at least a portion of the sidewalls 206 of the holes. However, in other embodiments, the coating does not extend into the holes.

Exemplary embodiments of coatings for the upper and lower surfaces of blocker plates and methods of forming the coatings will now be described. In one embodiment, a coating for the upper and lower surfaces of a blocker plate is an aluminum coating that is deposited by physical vapor deposition. The physical vapor deposition may be performed in any chamber that is capable of performing physical vapor deposition and is capable of supporting the blocker plate therein for a deposition process. An example of a physical vapor deposition chamber that may be used is a 300 mm Endura® PVD chamber, available from Applied Materials, Inc. of Santa Clara, Calif. It is noted that while in the embodiment described below, a chamber bake out and PVD process are performed in one chamber, the chamber bake out and PVD process may be performed in different chambers, such as two different PVD chambers on an integrated processing tool.

In one embodiment of a method of physical vapor depositing an aluminum coating on an upper surface and a lower surface of a blocker plate, a blocker plate is introduced into a physical vapor deposition chamber and placed on a shutter disk or dummy wafer on a substrate support in the chamber. Placing the blocker plate on a shutter disk or dummy wafer prevents unwanted deposition of the coating on the substrate support. As the shutter disk may be smaller than the blocker plate, the blocker plate should be centrally positioned on the shutter disk such that the blocker plate does not contact other components of the chamber, such as the cover ring.

Preferably, the chamber is then baked out to assist in desorbing water or any other unwanted gas species from the surfaces of the chamber. In one embodiment, the chamber is baked out for about 30-60 minutes at a substrate support temperature of about 150° C. The heat to the substrate support is continued, and infrared lamps in the chamber are then turned on at 50% power for about 60 minutes to provide an approximate blocker plate temperature of about 200° C. The chamber may then be cooled and held at a temperature, such as about 20° C., for a period of time, such as about 90 minutes. The chamber may then be maintained for a period of time, such as about 30-60 minutes, sufficient to provide a chamber pressure of about $8\times10^{-8}$ Torr or less and a chamber leak rate of less than about 3000 nT/minute.

After the blocker plate is positioned in the physical vapor deposition chamber and the chamber is optionally baked out, a gas, such as an inert gas, e.g., argon, is introduced into the chamber. The gas may be flowed into the chamber at a rate between about 10 sccm and about 200 sccm, such as at about 100 sccm. After the chamber pressure is stabilized, such as to a pressure between about 0.3 mTorr and about 4 mTorr, e.g., 2.7 mTorr, a plasma is struck in the chamber by applying a DC voltage to the target, The voltage is regulated by applying a DC power of about 1000 watts. The DC power is then increased, such as to between about 5 kW and about 40 kW, e.g., 22 kW. The chamber temperature may be near room temperature, e.g., 20-50° C., or between 20° C. and 250° C.

The target in the PVD chamber may have a composition that is substantially similar or identical to the coating that is physically vapor deposited on the blocker plate. For example, the target may be 99.5% or greater aluminum and about 0.5% copper.

In one embodiment, the DC power is maintained for a period of time sufficient to sputter material from a target comprising 99.5% aluminum and 0.5% copper and deposit an aluminum coating having a thickness of between about 0.5 μm and about 20 μm. For example, the DC power may be maintained for 60 seconds to deposit 1 μm of aluminum coating. In an alternative embodiment, the DC power is maintained for a first period of time to deposit a first amount of aluminum coating on either the upper or lower surface of the blocker plate. The DC power is then turned off. The gas flow into the chamber is then terminated for a period of time sufficient to produce a chamber pressure of less than about $1\times10^{-7}$ Torr and to allow the blocker plate to outgas and ensure that contaminant gas species are evacuated from the chamber. The gas flow is then resumed, and a plasma is struck in the chamber by applying a DC power to the target, such as a DC power of about 1000 watts. The DC power is then increased, such as to between about 5 kW and about 40 kW, e.g., 22 kW, and a second amount of aluminum coating is deposited. Thus, the aluminum coating is deposited in two steps. In further embodiments, the aluminum coating may be deposited in more than two steps by further repeating the steps described above. The final thickness of an aluminum coating deposited in two or more steps may be between about 0.5 μm and about 20 μm.

After the deposition of the desired amount of aluminum coating on either the upper or lower surface of the blocker plate, the flow of gas and the DC power in the chamber are terminated. After the chamber returns to a pressure of less than about $1\times10^{-7}$ Torr, the blocker plate is allowed to cool to an appropriate handling temperature, such as less than 55° C. The blocker plate may be cooled by leaving the chamber closed under a dry nitrogen atmosphere for a period of time, such as about 10 minutes. The chamber is then opened, and the blocker plate is flipped so that an aluminum coating may be deposited on the opposite surface of the blocker plate. The deposition of the aluminum coating on the opposite surface may be performed according to the embodiments provided above.

After the deposition of the aluminum coating on the upper and lower surfaces of the blocker plate, the blocker plate may be installed in a chemical vapor deposition chamber or packaged for storage.

While embodiments of the invention have been described primarily with respect to blocker plates having a physically vapor deposited aluminum coating on its upper and lower surfaces, it is recognized that there are other methods of providing a blocker plate having an upper surface and a lower surface each comprising a material that is at least about 99.5% pure. For example, an aluminum oxide coating may be formed on the upper and lower surfaces of a blocker plate by exposing an aluminum blocker plate to atmosphere or oxygen either at room temperature or at an elevated temperature, such as in furnace to obtain a thick oxide coating. An aluminum coating that is at least about 99.5% pure may also be formed by a thermal evaporation process. Alternatively, a blocker plate made of a conductive material or alloy can be electrolytically polished to provide an upper surface and a lower surface that is at least about 99.5% pure. Generally, methods that chemically and/or mechanically treat the blocker plate may be used.

EXAMPLE

A blocker plate comprising aluminum was placed on a shutter disk on a substrate support in a 300 mm Endura® PVD chamber. The chamber was baked out by setting the chamber temperature to 150° C. for 60 minutes and then turning on the IR lamps in the chamber at 50% power for 60 minutes to heat the blocker plate to about 200° C. The blocker plate was then cooled at a temperature of 20° C. for an additional 60 minutes. An aluminum coating (99.5% Al and 0.5% Cu) was then deposited on the upper surface of the blocker plate by flowing 100 sccm of argon into the chamber, striking a plasma at 1000 W DC power in the chamber and then increasing the power to 22 kW DC power for 60 seconds to deposit 1 μm of aluminum coating on the upper surface of the blocker plate. The DC power was turned off, and the flow of argon was terminated. When the chamber pressure reached $1\times10^{-7}$ Torr, the flow of argon into the chamber was resumed. A plasma was struck in the chamber by applying a DC power of 1000 W. The DC power was increased to 22 kW, and 1 μm of aluminum coating was deposited. The DC power and the flow of argon were terminated. The blocker plate was allowed to cool to a temperature of less than 55° C. The chamber was then opened and the blocker plate was flipped. An aluminum coating having a thickness of 2 μm was deposited on the lower surface of the blocker plate using the method described above to deposit the 2 μm aluminum coating on the upper surface of the blocker plate. The blocker plate was then installed in a chemical vapor deposition chamber.

The treated blocker plate of the Example was clean and free of contaminating particles. The blocker plate had a roughness of 13 Ra, compared to a typical roughness of 18 Ra for a similar untreated blocker plate. Residual gas analysis (RGA) was performed on the blocker plate after the chamber was baked out and before the aluminum coating was deposited. No abnormal gas species were detected. However, after the deposition of the aluminum coating, a high partial pressure of abnormal gas species was detected by RGA. For example, methane and several high atomic mass unit hydrocarbons were detected. The RGA indicated that these gases were quickly exhausted from the chamber. Thus, the PVD deposition of the aluminum coating liberated contaminating particles from the blocker plate that were not removed during the bake out.

Figure 4:
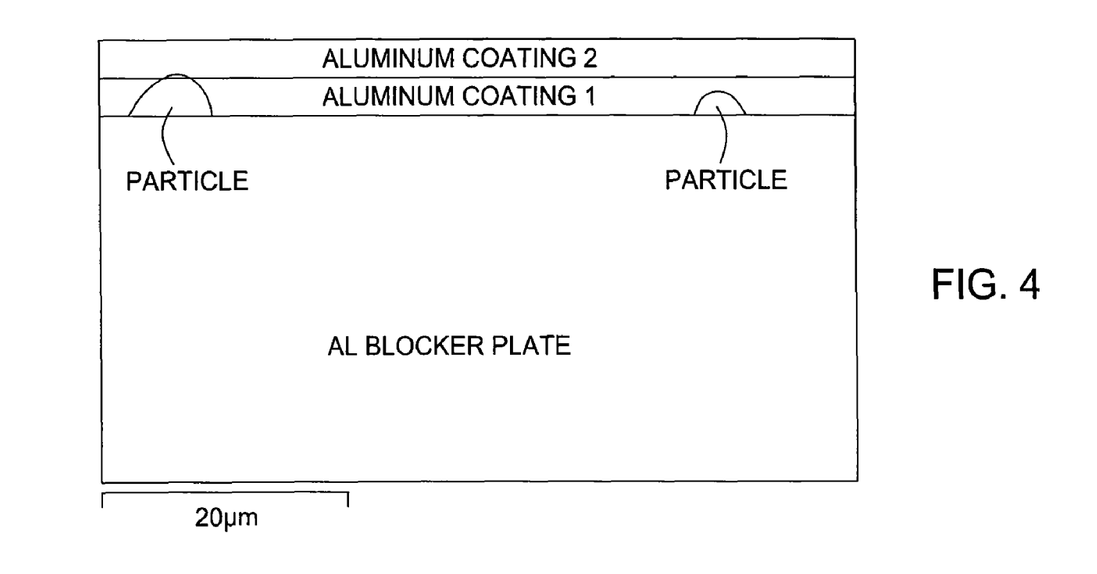
FIG. 4 is a sketch of a SEM of a blocker plate according to an embodiment of the invention.

FIG. 4 is a sketch of a SEM of a physical vapor deposited aluminum coating that includes two layers, shown as aluminum coating 1 and aluminum coating 2, on an aluminum blocker plate according to an embodiment of the invention. While the blocker plate has contaminating particles thereon, the aluminum coating provides a substantially smooth upper surface for the blocker plate as it is deposited to a thickness sufficient to mask the presence of the particle, i.e., at least about 0.5 µm. FIG. 4 shows that while the first layer of coating is not thick enough to mask both particles, the total amount of coating is sufficient to mask both particles. Thus, the aluminum coating seals in contaminating particles, such as aluminum oxide or aluminum particles, that are typically found on blocker plates comprising aluminum and prevents the particles from flaking off. The aluminum coating also functions as a barrier or passivation layer that masks blocker plate precipitates, such as iron, manganese, and nickel. It is believed that such precipitates provide nucleation sites for particle development or the formation of an undesirable discontinuous native oxide layer on the blocker plate. A 60% reduction in particles generated during aluminum chemical vapor deposition has been obtained for aluminum chemical vapor deposition processes performed with the aluminum precursor methyl pyrrolidine alane and a blocker plate having the aluminum coating of the invention in an AxZ chamber. A 3x lifetime improvement has been proven increasing the time between preventative maintenance respectively.

In another aspect, in addition to improving the surface roughness of the blocker plate, it is believed that the aluminum coating provides a substantially pure, uniform seed layer in the event that a native oxide forms on the blocker plate.

Further embodiments of the invention provide a method of reducing particle contamination in a chemical vapor deposition chamber by minimizing the formation of deposits in the gas line that connects the gas source to the chemical vapor deposition chamber. The method may be used to reduce the particles in an aluminum CVD chamber, such as an AxZ chamber, that is used to deposit aluminum from the precursor 1-methylpyrrolidine alane (MPA), for example.

Figure 5:
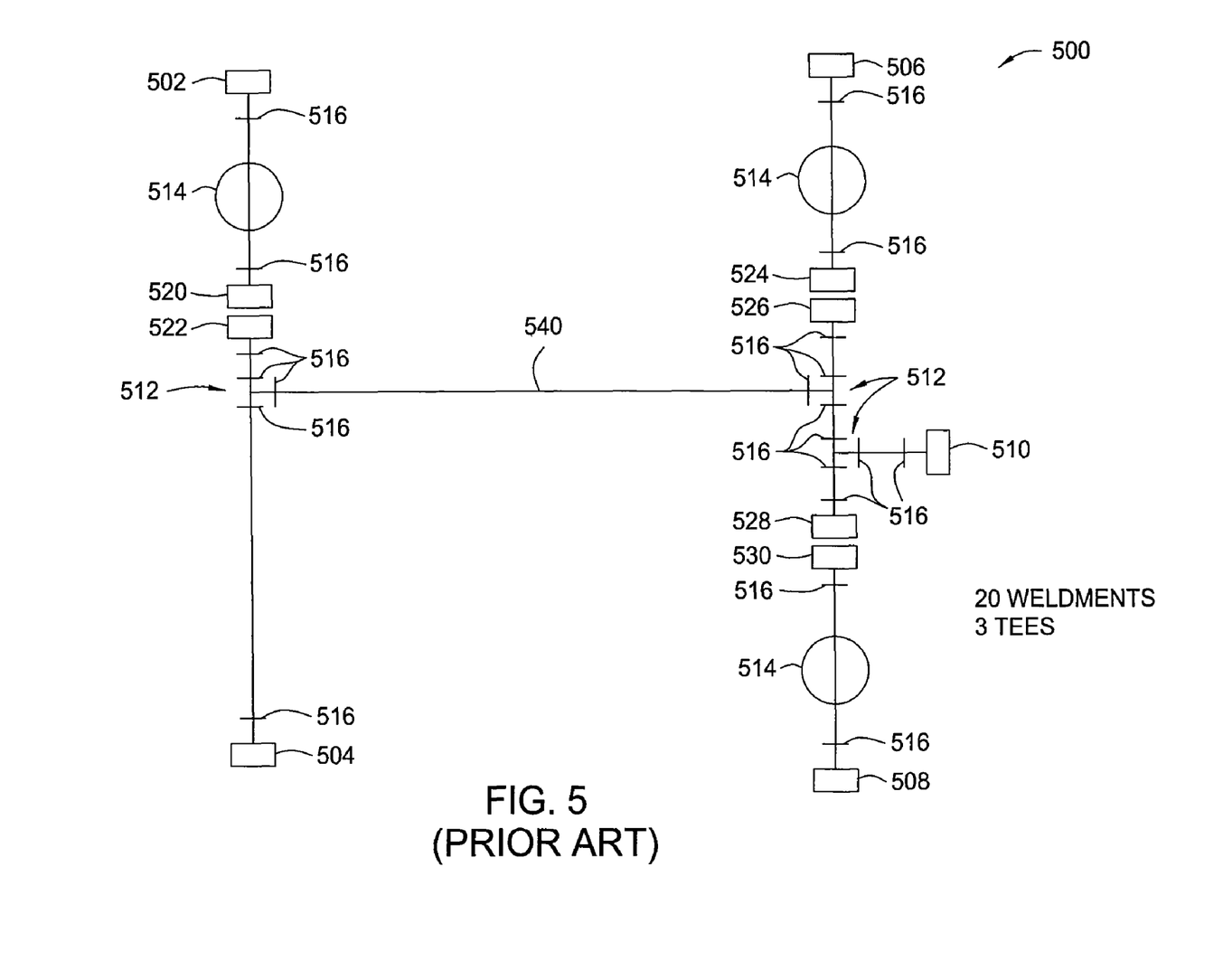
FIG. 5 is a sketch of a gas line design according to the prior art.

FIG. 5 illustrates a prior art gas line design 500 having flange connectors for connecting a gas source to a CVD chamber. Flange connector 502 connects the gas lines to a nitrogen purge gas source (not shown). Flange connector 504 connects the gas lines to a precursor ampoule (not shown). Flange connector 506 connects the gas lines to a CVD chamber (not shown). Flange connector 508 connects the gas lines to a bypass line (not shown). Flange connector 510 connects the gas lines to a pressure gauge (not shown). The prior art gas line design includes 3 tee-fittings 512 and three shut-off valves 514 that may trap precursors from the gas source such that material is undesirably deposited in the gas line. The prior art gas line design also includes 20 weldments 516, which provide surfaces inside the gas line that may nucleate particle formation. The prior art gas line design further comprises flange connectors 520, 522, 524, 526, 528, and 530.

Figure 6:
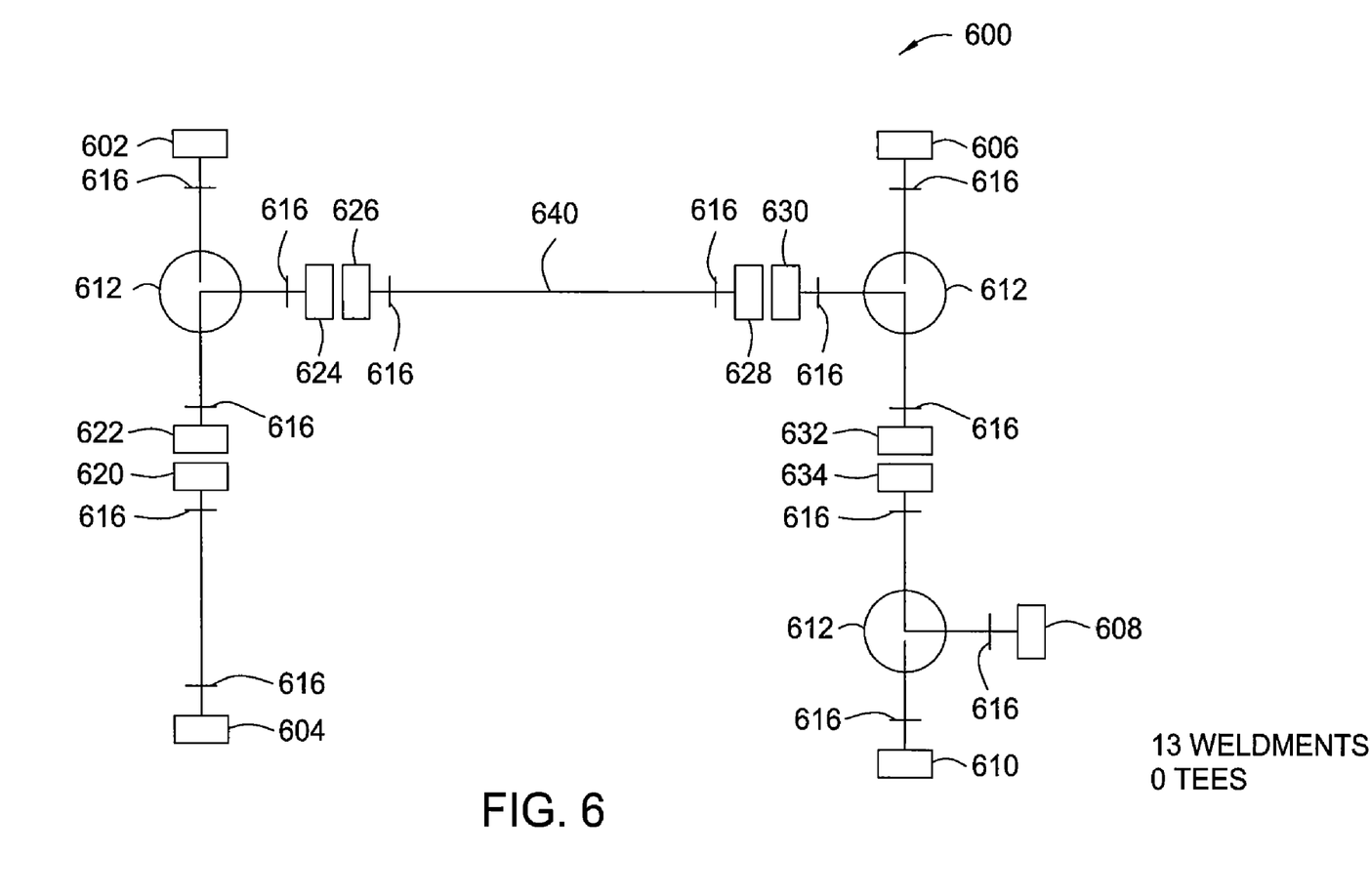
FIG. 6 is a sketch of a gas line design according to an embodiment of the invention.

FIG. 6 illustrates a gas line design 600 for connecting a gas source to a CVD chamber according to an embodiment of the invention. Gas line design 600 also includes flange connectors. Flange connector 602 connects the gas lines to a nitrogen purge gas source (not shown). Flange connector 604 connects the gas lines to a precursor ampoule (not shown). Flange connector 606 connects the gas lines to a CVD chamber (not shown). Flange connector 608 connects the gas lines to a bypass line (not shown). Flange connector 610 connects the gas lines to a pressure gauge (not shown). Three-way valves 612 are used to connect the gas lines instead of tee-fittings, which reduces the amount of "dead space" that may trap precursors, and the three-way valves provide more effective purging of any precursors that are trapped in the lines. In another embodiment, four-way valves may be used. The gas line design 600 includes weldments 616, but the number of weldments is reduced to 13. The gas line design 600 further includes flange connectors 620, 622, 624, 626, 628, 630, 632, and 634. The flange connectors 620, 622, 624, 626, 628, 630, 632, and 634 provide detachable or reversible connections. The flange connectors may be bolted together and then unbolted to separate the gas lines therebetween. Thus, for example, gas line 640 between flange connectors 626 and 628 may be removed easily and electropolished. A similar gas line 540 in the prior art gas line design 500 cannot be easily removed and electropolished as it is located between weldments 516.

In the embodiment of FIG. 6, only straight gas lines are used. Straight gas lines facilitate the electropolishing of the inner surface of the lines, which necessitates inserting an electrode in the center of the gas lines.

After the gas lines are welded to form the gas line design as shown, the inner surfaces of the lines are electropolished and passivated to form smoother inner surfaces that are more resistant to particle formation thereon. In one aspect, the electropolishing and passivation provides a chrome oxide coating on the inner surfaces of the gas lines. The chrome oxide coating may be followed by a nitric acid treatment.

While the foregoing is directed to embodiments of the present invention, other and further embodiments of the invention may be devised without departing from the basic scope thereof, and the scope thereof is determined by the claims that follow.

What is claimed is:

1. A method for treating a blocker plate in a processing chamber, comprising:
    positioning the blocker plate in the processing chamber, the blocker plate having an upper surface, a lower surface, and a plurality of holes extending between the upper surface and the lower surface;
    flowing a process gas into the processing chamber;
    physical vapor depositing an aluminum coating on the upper surface of the blocker plate;
    terminating the flow of the process gas to the processing chamber and degassing the blocker plate;
    flipping the blocker plate; and
    physical vapor depositing an aluminum coating on the lower surface of the blocker plate.

2. The method of claim 1, wherein the aluminum coating is physical vapor deposited on the upper surface or the lower surface using a DC power of between about 5 kW and about 40 kW.

3. The method of claim 1, wherein the physical vapor deposition on the upper surface or the lower surface is performed for a period of time sufficient to form an aluminum coating having a thickness between about 0.5 µm and about 20 µm, and wherein the aluminum coating has a surface roughness less than about 18 Ra.

4. The method of claim 3, wherein physical vapor depositing an aluminum coating on the upper surface comprises:
    flowing a process gas into the processing chamber and physical vapor depositing a first aluminum coating on the upper surface of the blocker plate for a first period of time;
    terminating the flow of the process gas into the chamber for a period of time sufficient to produce a chamber pressure of less than about $1 \times 10^{-7}$ Torr;
    re-starting the flow of the process gas into the chamber; and physical vapor depositing a second aluminum coating on the blocker plate for a second period of time.

5. A method for treating a blocker plate, comprising:
positioning a blocker plate in a processing chamber, the blocker plate having an upper surface, a lower surface, and a plurality of holes extending between the upper surface and the lower surface;
physical vapor depositing a first coating on the upper surface of the blocker plate;
degassing the blocker plate for a period of time;
physical vapor depositing a second coating on the upper surface of the blocker plate;
flipping the blocker plate;
physical vapor depositing a third coating on the lower surface of the blocker plate;
degassing the blocker plate for a second period of time; and
physical vapor depositing a fourth coating on the lower surface of the blocker plate.

6. The method of claim 5, wherein the first coating, the second coating, the third coating, and the fourth coating comprise greater than 99.5 percent aluminum.

7. The method of claim 5, wherein the first coating, the second coating, the third coating, and the fourth coating comprise about 99.5 percent aluminum and about 0.5% copper.

8. The method of claim 6, wherein a total thickness of the first coating and the second coating deposited on the upper surface is between about 0.5 µm and about 20 µm, and wherein the second and fourth coatings each have a surface roughness less than about 18 Ra.

9. The method of claim 3, further comprising cooling the blocker plate prior to physical vapor depositing the aluminum coating on the lower surface of the blocker plate.

10. The method of claim 3, wherein the blocker plate is formed from a material having a purity less than 98 percent.

11. The method of claim 3, wherein the blocker plate is formed from aluminum.

12. The method of claim 11, wherein the process gas comprises argon.

13. The method of claim 12, further comprising cooling the blocker plate to a temperature less than about 55° C. prior to the physical vapor depositing an aluminum coating on the lower surface of the blocker plate.

14. The method of claim 3, wherein the terminating the flow of the process gas to the processing chamber comprises allowing the processing chamber to reach a pressure of less than about $1 \times 10^{-7}$ Torr.

15. The method of claim 3, wherein the aluminum coating on the upper surface of the blocker plate and the aluminum coating on the lower surface of the blocker plate each have a purity of at least about 99.5 percent.

16. The method of claim 7, further comprising physical vapor depositing a fifth coating on the lower surface of the blocker plate.

17. A method for treating a blocker plate, comprising:
positioning the blocker plate in a processing chamber, the blocker plate having an upper surface, a lower surface, and a plurality of holes extending between the upper surface and the lower surface;
flowing an inert gas into the processing chamber;
physical vapor depositing a first aluminum coating on the upper surface of the blocker plate, the first aluminum coating having a purity of at least about 99.5 percent;
degassing the blocker plate, the degassing comprising terminating the flow of the inert gas to the processing chamber until the processing chamber reaches an internal pressure of less than about $1 \times 10^{-7}$ Torr;
resuming the flow of the inert gas into the processing chamber;
physical vapor depositing a second aluminum coating on the upper surface of the blocker plate, the second aluminum coating having a purity of at least about 99.5 percent and a surface roughness of less than about 18 Ra;
cooling the blocker plate to a temperature of less than about 55° C.;
flipping the blocker plate;
flowing an inert gas into the processing chamber;
physical vapor depositing a third aluminum coating on the lower surface of the blocker plate, the third aluminum coating having a purity of at least about 99.5 percent;
degassing the blocker plate, the degassing comprising terminating the flow of the inert gas to the processing chamber until the processing chamber reaches an internal pressure of less than about $1 \times 10^{-7}$ Torr; and
physical vapor depositing a fourth aluminum coating on the lower surface of the blocker plate, the fourth aluminum coating having a purity of at least 99.5 percent and a surface roughness of less than about 18 Ra.

* * * * *

UNITED STATES PATENT AND TRADEMARK OFFICE
CERTIFICATE OF CORRECTION

| | | |
|---|---|---|
| PATENT NO. | : 7,857,947 B2 | Page 1 of 1 |
| APPLICATION NO. | : 11/459531 | |
| DATED | : December 28, 2010 | |
| INVENTOR(S) | : Ritchie et al. | |

It is certified that error appears in the above-identified patent and that said Letters Patent is hereby corrected as shown below:

Column 10, Claim 17, Line 43, please insert --about-- after least.

Signed and Sealed this
Twenty-second Day of March, 2011

David J. Kappos
*Director of the United States Patent and Trademark Office*